United States Patent
Horio et al.

(10) Patent No.: US 7,271,426 B2
(45) Date of Patent: Sep. 18, 2007

(54) SEMICONDUCTOR LIGHT EMITTING DEVICE ON INSULATING SUBSTRATE AND ITS MANUFACTURE METHOD

(75) Inventors: Naochika Horio, Tokyo (JP);
Masahiko Tsuchiya, Tokyo (JP);
Munehiro Kato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 45 days.

(21) Appl. No.: 10/971,305

(22) Filed: Oct. 22, 2004

(65) Prior Publication Data
US 2005/0253161 A1 Nov. 17, 2005

(30) Foreign Application Priority Data
May 11, 2004 (JP) .............................. 2004-141380

(51) Int. Cl.
| | |
|---|---|
| H01L 33/00 | (2006.01) |
| H01L 23/48 | (2006.01) |
| H01L 23/52 | (2006.01) |
| H01L 21/00 | (2006.01) |
| H01L 21/44 | (2006.01) |

(52) U.S. Cl. .................... 257/99; 257/81; 257/778; 438/26; 438/28; 438/108

(58) Field of Classification Search ............. 257/99, 257/98, 778, 81; 438/26, 28, 34, 39, 108
See application file for complete search history.

(56) References Cited

U.S. PATENT DOCUMENTS 5,501,990 A * 3/1996 Holm et al. .................. 438/34
5,661,313 A * 8/1997 Dubbelday et al. ......... 257/103
6,958,498 B2 * 10/2005 Shelton et al. ................ 257/99
6,977,396 B2 * 12/2005 Shen et al. .................. 257/100
2001/0024460 A1 * 9/2001 Yamamoto et al. ........... 372/36
2001/0032985 A1 * 10/2001 Bhat et al. ..................... 257/88

FOREIGN PATENT DOCUMENTS

| JP | 2914065 B2 | 4/1999 |
|---|---|---|
| JP | 3136672 B2 | 12/2000 |
| JP | 2002-270905 A | 9/2002 |
| JP | 2003-110148 A | 4/2003 |

* cited by examiner

*Primary Examiner*—Shouxiang Hu
(74) *Attorney, Agent, or Firm*—Frishauf, Holtz, Goodman & Chick, P.C.

(57) ABSTRACT

A semiconductor LED device includes: a transparent substrate stacked on which are an n-type nitride semiconductor layer, a nitride semiconductor light emission layer and a p-type nitride semiconductor layer; recess regions cutting the p-type layer and light emission layer and exposing the n-type layer, defining a plurality of mesa active regions and mesa electrode pull-up regions; an n-side electrode formed on the n-type layer in the recess surrounding the mesa active regions and extending onto the mesa electrode pull-up regions; a p-side electrode formed on the p-type layer of each of the mesa active regions; and a support substrate including n-side connection members connected to and facing the n-type electrodes and p-side connection members connected to and facing the p-side electrodes.

30 Claims, 14 Drawing Sheets

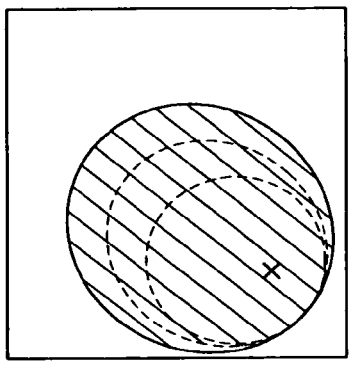
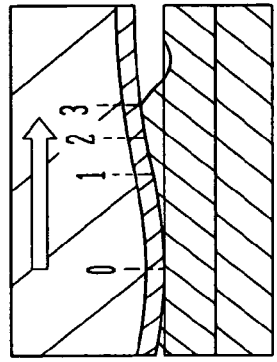
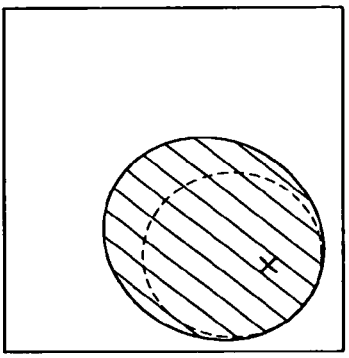
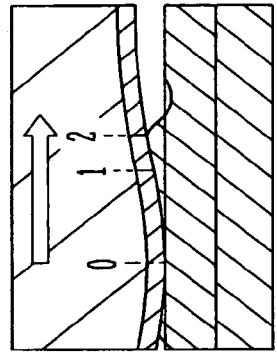
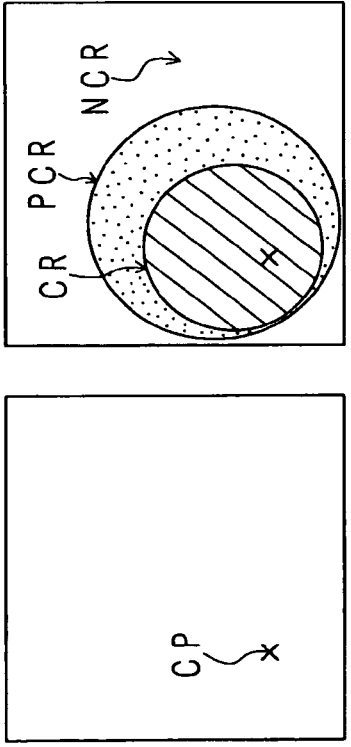
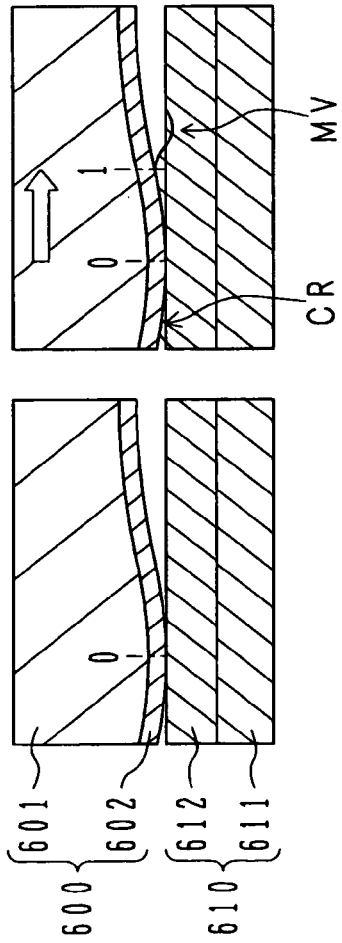

- CR
- PCR
- NCR

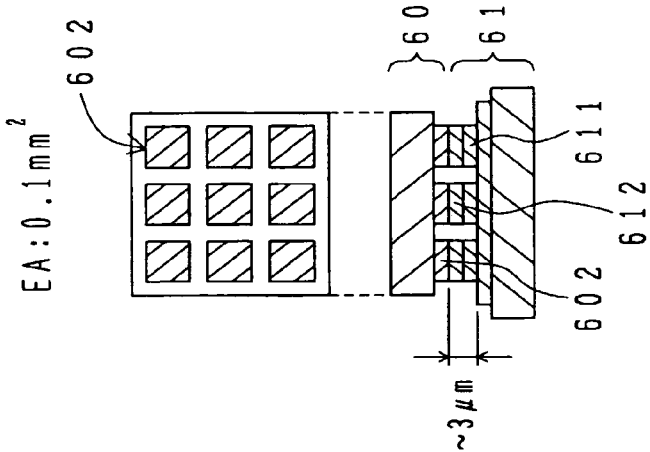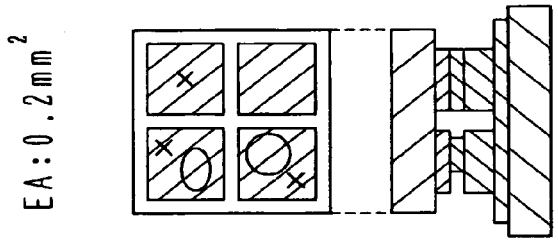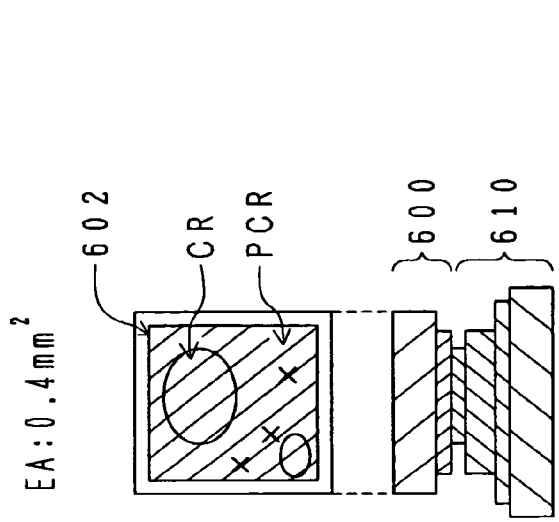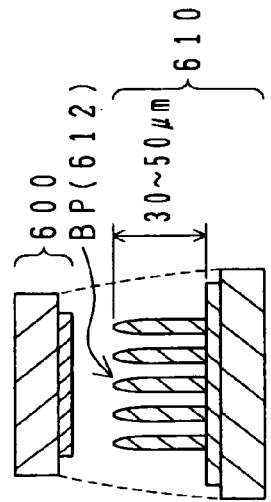

$\tau_{SV} = \tau_{LV} \cdot \cos\theta + \tau_{SL}$ ...(1)

$\theta$ : CONTACT ANGLE
$\tau_{SV}$ : SOLID SURFACE TENSION
$\tau_{SL}$ : SOLID BOUNDARY TENSION
$\tau_{LV}$ : LIQUID SURFACE TENSION

SEMICONDUCTOR LIGHT EMITTING DEVICE ON INSULATING SUBSTRATE AND ITS MANUFACTURE METHOD

CROSS REFERENCE TO RELATED APPLICATION

This application is based on and claims priority of Japanese Patent Application No. 2004-141380 filed on May 11, 2004, the entire contents of which are incorporated herein by reference.

BACKGROUND OF THE INVENTION

A) Field of the Invention

The present invention relates to a semiconductor light emitting device and its manufacture method, and more particularly to a semiconductor light emitting device having a semiconductor light emission structure formed on a transparent single crystal substrate such as sapphire and its manufacture method.

B) Description of the Related Art

Semiconductor light emitting devices for blue light emission are widely known which utilize nitride semiconductor (called GaN series (compound) semiconductor) such as GaN, GaAlN, InGaN and InAlGaN. If a light emitting diode (LED) for blue light emission is covered with a wavelength conversion layer which contains fluorescent material, white light can be radiated. White light can be used for illumination and the like.

A GaN series semiconductor layer is generally grown on a sapphire substrate which is an insulating transparent single crystal substrate. Electrodes of an LED are therefore required to be led from the surface side opposite to the sapphire substrate. Light emission occurs in an omnidirection. Output light may be picked up from the sapphire substrate side.

Recent high outputs of light emitting diodes have broadened the markets from a conventionally used display field to an illumination field such as special illumination, general illumination and automobile illumination. The die size of LEDs has become large from about 300 µm square to 1 mm and 2 mm square. As the die size becomes large, some problems have been actualized, such as light emission variations, current supply disturbances and device exothermic.

Japanese Patent Laid-open Publication No. 2002-270905 proposes to mount a plurality of light emitting devices formed on a sapphire substrate, on one sub-mount device made of a silicon substrate by using bumps. Since a plurality of light emitting devices are integrated, a high light emission amount can be obtained. The silicon substrate having a more excellent heat radiation performance than the sapphire substrate enhances heat radiation so that since a light emission efficiency can be suppressed from being lowered by exothermic, the light emission efficiency can be improved and an excellent illumination light source can be obtained.

Japanese Patent Laid-open Publication No. 2003-110148 proposes a semiconductor light emitting device having an improved heat radiation wherein semiconductor light emitting devices are formed on a sapphire substrate which is mounted on a mount substrate, and electrical connection bumps and electrically insulated bumps are inserted between the sapphire substrate and mount substrate.

Japanese Patent Publication No. 3136672 proposes the structure wherein an i-type gallium nitride series semiconductor layer doped with p-type impurities is stacked on an n-type gallium nitride series semiconductor layer, one electrode is formed on the surface of the i-type gallium nitride series semiconductor layer, the region of the i-type gallium nitride series semiconductor layer in the peripheral area of the one electrode is etched, and another electrode surrounding the one electrode is formed on the whole circumference surface including the side wall, to make uniform the current flowing between the electrodes and to output laterally escaping light by reflecting it.

Japanese Patent Publication No. 2914065 proposes to prevent a short circuit to be caused by silver paste which is used when lead electrodes of a gallium nitride series light emitting diode are connected, by forming an insulating protective film on a semiconductor layer between a pair of electrode layers.

SUMMARY OF THE INVENTION

An object of this invention is to provide a semiconductor light emitting device having a nitride semiconductor light emission layer, capable of supplying current readily to a whole light emission region and efficiently providing a high light output, and its manufacture method.

Another object of this invention is to provide a semiconductor light emitting device having a nitride semiconductor light emission layer, capable of efficiently emitting light in a broad light emission region.

According to one aspect of the present invention, there is provided a semiconductor light emitting device comprising: a transparent substrate; a first conductivity type nitride semiconductor layer formed above the transparent substrate; a nitride semiconductor light emission layer formed above the first conductivity type nitride semiconductor layer; a second conductivity type nitride semiconductor layer formed above the nitride semiconductor light emission layer, the second conductivity type being opposite to the first conductivity type; recess regions formed by cutting the second conductivity type nitride semiconductor layer and the nitride semiconductor light emission layer and exposing the first conductivity type nitride semiconductor layer, the recess regions defining a plurality of mesa active regions and mesa electrode pull-up regions; a first conductivity type side electrode including a first conductivity type side ohmic electrode portion formed on the first conductivity type nitride semiconductor layer exposed on the recess regions surrounding the plurality of mesa active regions and first conductivity type side pad electrode portions being continuous with the first conductivity type side ohmic electrode portion and extending onto the mesa electrode pull-up regions; a second conductivity type side ohmic electrode formed on the second conductivity type nitride semiconductor layer of each of the plurality of mesa active regions; and a support substrate disposed opposite to the transparent substrate, the support substrate including first conductivity type side conductive connection members facing and connected to the first conductivity type side pad electrode portions and second conductivity type side conductive connection members facing and connected to the second conductivity type ohmic electrode portions.

According to another aspect of the present invention, there is provided a method for manufacture a semiconductor light emitting device, comprising steps of: (a) preparing a light emitting device substrate having a first conductivity type nitride semiconductor layer, a nitride semiconductor light emission layer and a second conductivity type nitride semiconductor layer, the second conductivity type being opposite to the first conductivity type, formed above a transparent substrate; (b) selectively etching a whole thickness of the second conductivity type nitride semiconductor layer and the nitride semiconductor light emission layer and a partial thickness of the first conductivity type nitride semiconductor layer to form recess regions which define a plurality of mesa active regions and mesa electrode pull-up regions; (c) forming a first conductivity type side electrode extending from the first conductivity type nitride semiconductor layer exposed in the recess regions surrounding the mesa active regions onto the mesa electrode pull-up regions; and (d) forming a second conductivity type side electrode on the second conductivity type nitride semiconductor layer of each of the mesa active regions.

A plurality of mesa active regions surrounded by the recess regions are formed in the light emission area, one electrode is formed on the recess regions surrounding the mesa active regions and the other electrodes are formed on the mesa active regions. Accordingly, current can be supplied efficiently at a low resistance to any position in the light emission area.

BRIEF DESCRIPTION OF THE DRAWINGS

FIGS. 9AH to 9DH and FIGS. 9AV to 9DV are plan views and cross sectional views illustrating a bonding process.

FIGS. 11A to 11D are plan views and cross sectional views illustrating the relation between a designed bonding area and an actual bonding area.

DESCRIPTION OF THE PREFERRED EMBODIMENTS

Embodiments of the invention will be described with reference to the accompanying drawings.

Figure 2A:
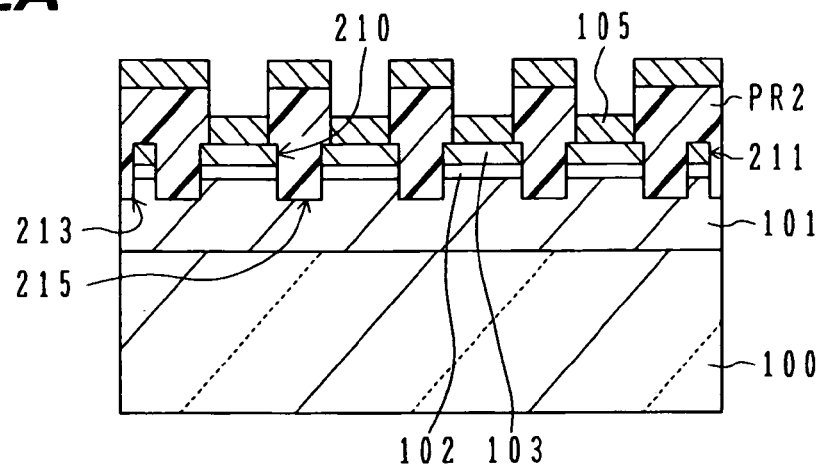
FIGS. 2A to 2C are cross sectional views and a plan view illustrating the semiconductor light emitting device according to the first embodiment.
Figure 2B:
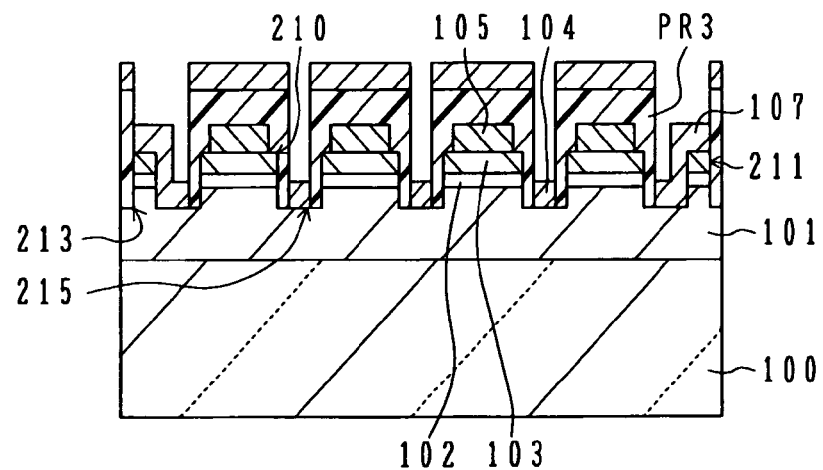
Figure 2C:
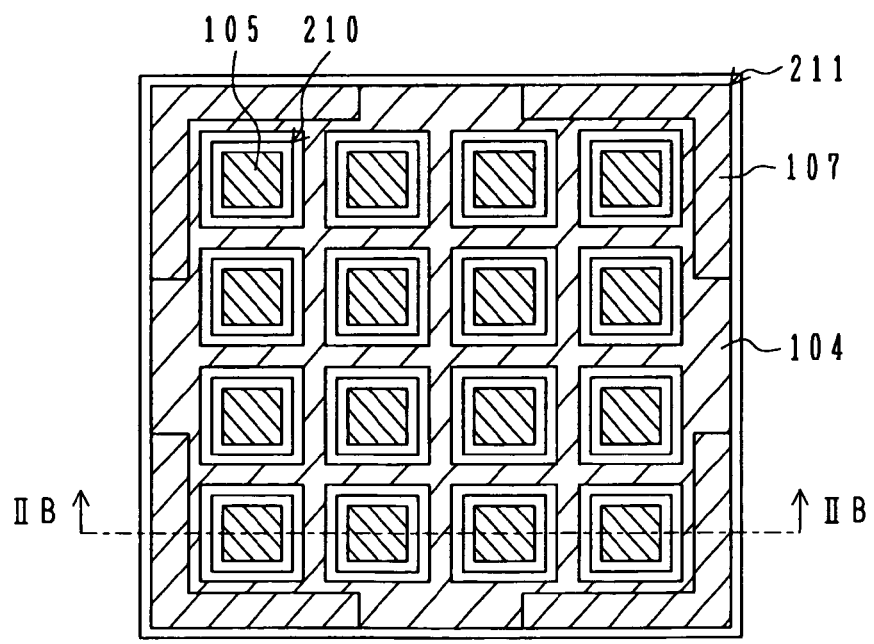
Figure 3:
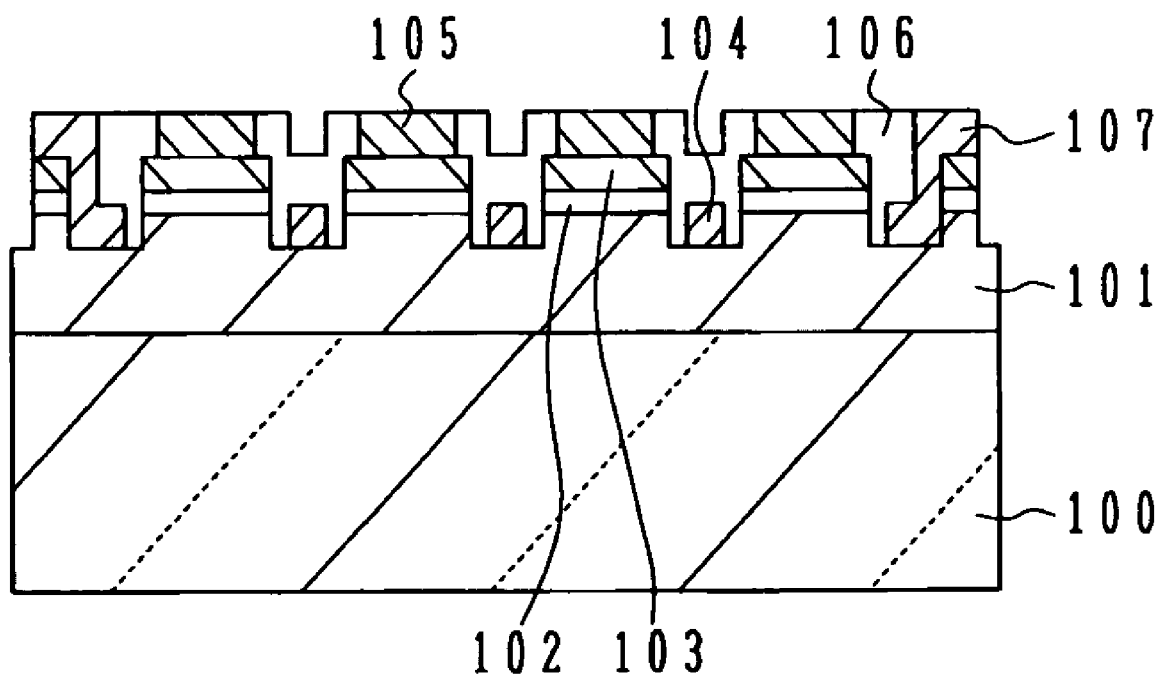
FIG. 3 is a cross sectional view illustrating the semiconductor light emitting device according to the first embodiment.
Figure 4A:
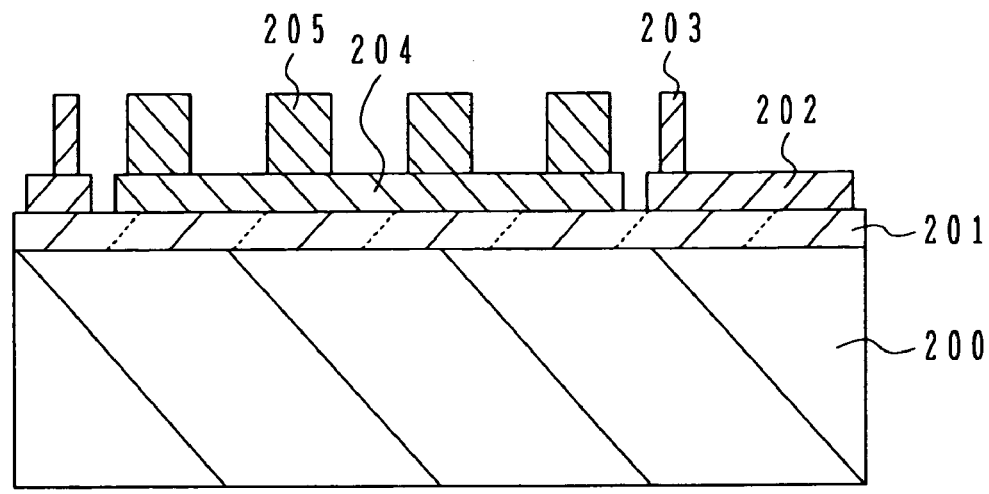
FIGS. 4A and 4B are a cross sectional view and a plan view illustrating the semiconductor light emitting device according to the first embodiment.
Figure 4B:
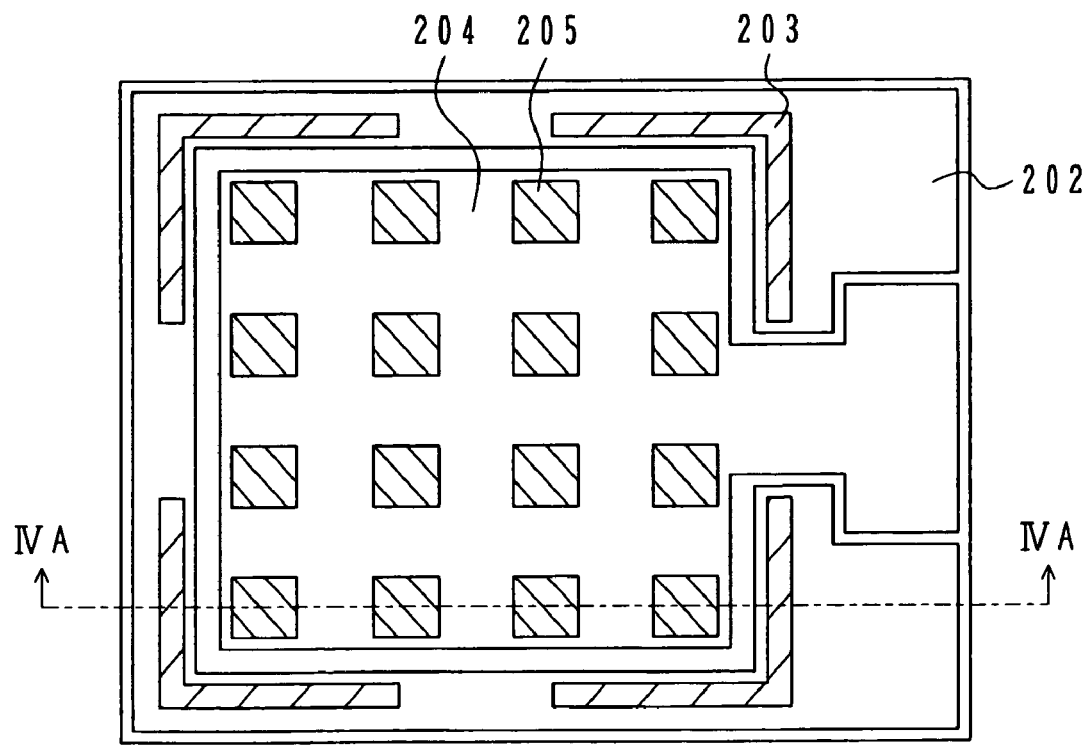
Figure 5A:
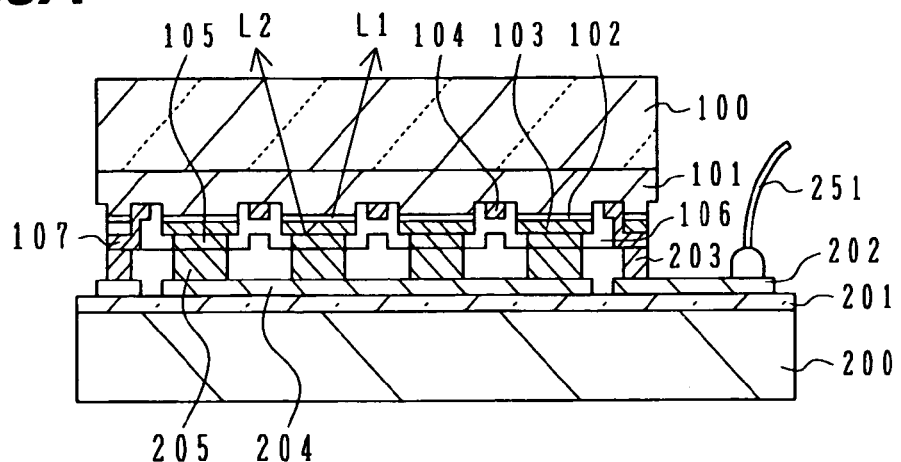
FIGS. 5A to 5C are cross sectional views and a plan view illustrating the semiconductor light emitting device according to the first embodiment.
Figure 5B:
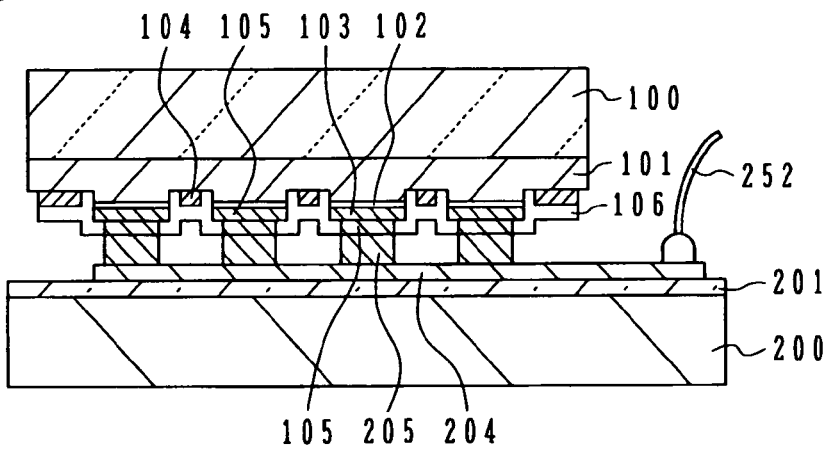
Figure 5C:
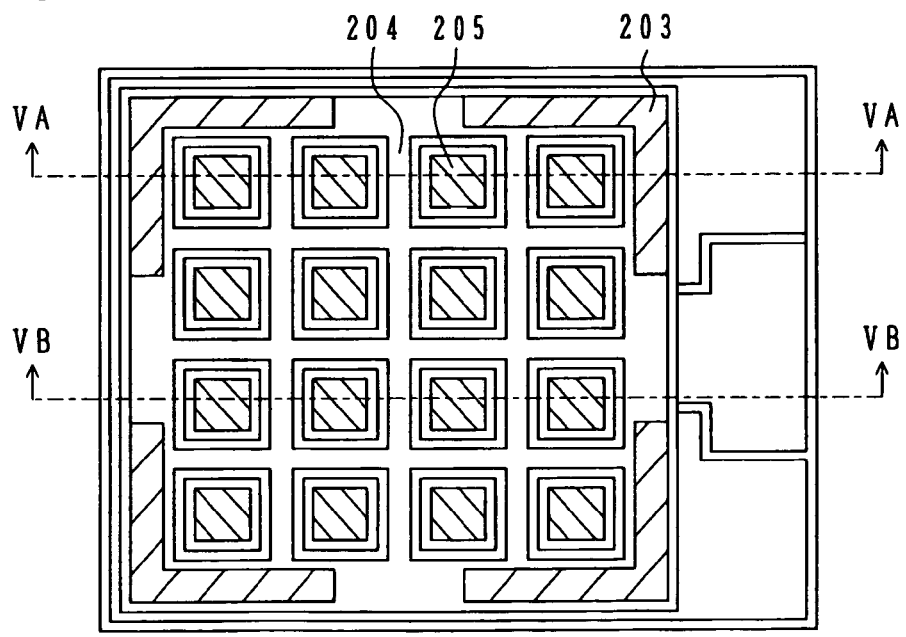

FIGS. 1A to 1C, FIG. 2A to 2C, FIG. 3, FIGS. 4A and 4B and FIGS. 5A to 5C are cross sectional views and plan views illustrating a method for manufacture a semiconductor light emitting device according to the first embodiment of the invention. FIGS. 1A to 1C, FIG. 2A to 2C and FIG. 3 are cross sectional views and plan views of a semiconductor light emitting device substrate, FIGS. 4A and 4B are a cross sectional view and a plan view of a support substrate, and FIGS. 5A to 5C are cross sectional views and a plan view of the semiconductor light emitting device having a semiconductor light emitting device substrate bonded to the support substrate.

Figure 1A:
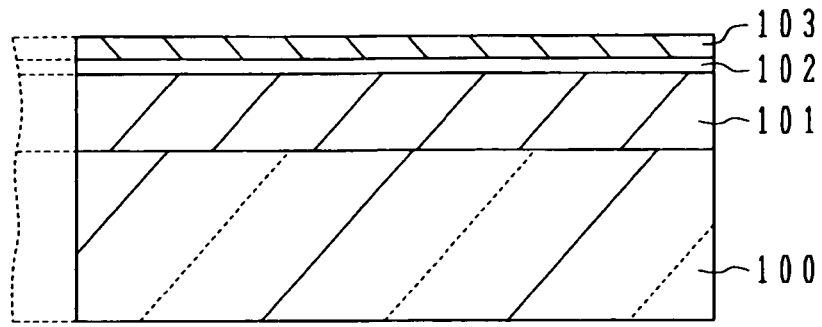
FIGS. 1A to 1C are cross sectional views and a plan view illustrating a semiconductor light emitting device according to a first embodiment.

As shown in FIG. 1A, on the surface of a sapphire substrate 100, a GaN series nitride semiconductor layers 101, 102 and 103 are epitaxially grown. Epitaxial growth can be performed by metal organic vapor phase epitaxial (MOVPE) growth, molecular beam epitaxial (MBE) growth or the like.

If necessary, a buffer layer of GaN series nitride semiconductor is grown on the sapphire substrate 100 at a temperature lower than an epitaxial growth temperature. Next, a GaN series n-type nitride semiconductor layer 101 is epitaxially grown at the epitaxial growth temperature. On the n-type nitride semiconductor layer 101, a GaN series nitride semiconductor light emission layer 102 having a light emission function is epitaxially grown and then a p-type GaN series nitride semiconductor layer 103 doped with p-type impurities is epitaxially grown. A summed thickness of the light emitting layer 102 and p-type layer 103 is, for example, 0.4 μm.

The light emission layer may be a single layer or a multi-quantum well structure having barrier layers and well layers alternately stacked. A space layer or the like may also be formed. The lamination structure of a light emitting diode may adopt any of well-known various structures.

Figure 1B:
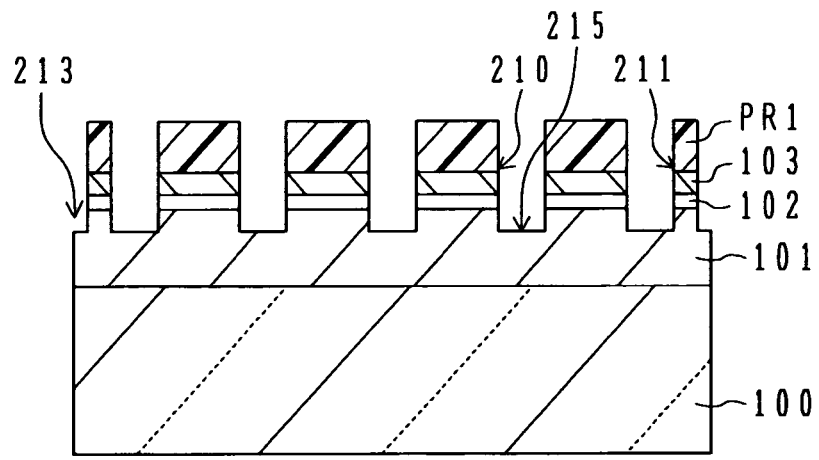

As shown in FIG. 1B, a photoresist pattern PR1 is formed on the surface of the p-type layer 103, the photoresist pattern covering mesa active regions 210 and mesa electrode pull-up regions 211 and exposing the peripheral areas of these regions.

Figure 1C:
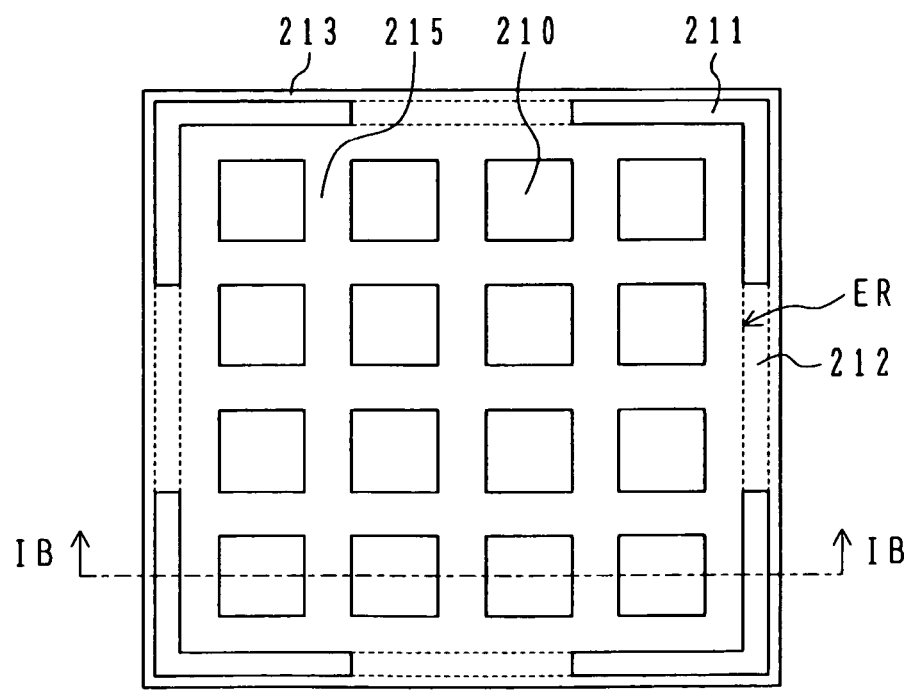

As shown in FIG. 1C, the mesa active regions 210 are rectangular regions disposed in a rectangular light emission region ER in a square matrix shape. The mesa electrode pull-up region 211 is an L-character shaped region disposed outside of each vertex of the rectangular light emission region ER. Openings are formed through the photoresist pattern in the areas outside of the L-character shaped regions. Although one chip is shown, a number of chips are disposed on a wafer in an actual manufacture process. The plan shape of a chip is, for example, a square having a side length of 1 mm. The plan shape of the mesa active region is, for example, a square having a side length of 180 μm. A recess region 212 between adjacent L-character shaped regions 211 has a length of, for example, 300 μm. The area of each mesa active region is preferably set to 0.01 mm² (square of 0.1 mm) to 0.2 mm² (square of 0.447 mm). The overall plan shape has 90° rotation al symmetry. At a later bonding process, the light emitting device substrate can be aligned in position by rotation of 90° or smaller.

By using the photoresist pattern PR1 as an etching mask, the total thickness of the p-type layer 103 and light emission layer 102 and a partial thickness of the n-type layer 101 are removed by reactive ion etching to form trenches 215 and a recess region including an outer peripheral region 213. The depth of the recess region 213 and trenches 215 is set to, for example, 0.6 µm as measured from the substrate surface, and the recess region 213 and trenches 215 have the shape that they perfectly penetrate through the summed thickness of 0.4 µm of the p-type layer 103 and light emission layer 102 and enter the partial depth of the n-type layer 101.

As shown in FIG. 1C, a plurality of trenches 215 are formed along two crossing directions and define the m×n mesa active regions 210 disposed in a square matrix shape. The outer peripheral region 213 together with the outermost trench defines the mesa electrode pull-up region 211. The trenches have a function of separating the mesa active regions and mesa electrode pull-up regions and may be called isolation or separation regions.

A recess region 212 is formed at a central outer side along each side of the rectangular light emitting region, by removing the mesa electrode pull-up region. Therefore, the plan shape of the mesa electrode pull-up region 211 is of an L-character shape. The L-character shape may be used as an alignment mark. The recess region 212, and the trench 215 and recess region 213 on both sides thereof constitute a same plane. The recess region 212 faces a wiring region of the support substrate to be described later to prevent a short circuit.

After the etching, the photoresist pattern PR1 is removed. In this manner, the recess regions having the same depth are formed, including the outer peripheral recess region 213, recess regions 212 between adjacent mesa electrode pull-up regions 211 and trenches 215 defining the mesa active regions. The mesa electrode pull-up region 211 has the same height (level) as that of the mesa active regions 210. As an n-side electrode to be formed on the n-type region 101 exposed on the bottoms of the trenches 215 is extended continuously onto the mesa electrode pull-up regions 211, the n-side electrode can be pulled up to the same height (level) as that of electrodes to be formed on the mesa active regions 210.

As shown in FIG. 2A, a photoresist pattern PR2 is formed on the substrate surface, the photoresist pattern PR2 having openings in the areas corresponding to the p-type regions 103 excepting the peripheral area of the mesa active region. Electron beam vacuum deposition is performed to deposit a Pt (platinum) layer having thickness of 1 nm, a Rh (rhodium) layer having a thickness of 100 nm, a Ti layer having a thickness of 100 nm, a Pt layer having a thickness of 100 nm, an Au layer having a thickness of 100 nm, a Pt layer having a thickness of 100 nm and an Au layer having a thickness of 200 nm (these layers are collectively represented by Pt/Rh/Ti/Pt/Au/Pt/Au). Therefore, p-side electrodes 105 are formed on the p-type layers 103 of the mesa active regions. The electrode layer is also deposited on the surface of the photoresist layer. The photoresist pattern PR2 and the metal layer deposited thereon are removed (lifted off) to leave the p-side electrodes 105.

As shown in FIG. 2B, a photoresist pattern PR3 is formed on the substrate surface, the photoresist pattern PR3 having an opening which is continuous from the electrode forming regions of the n-type regions 101 exposed on the bottoms of the trenches 215 to the electrode forming regions in the mesa electrode pull-up regions 211. Electron beam vacuum deposition is performed to deposit an Al layer having a thickness of 3 nm, a Rh layer having a thickness of 100 nm, a Ti layer having a thickness of 100 nm, a Pt layer having a thickness of 100 nm, an Au layer having a thickness of 100 nm, a Pt layer having a thickness of 100 nm and an Au layer having a thickness of 200 nm (these layers are collectively represented by Al/Rh/Ti/Pt/Au/Pt/Au). An n-side ohmic electrode 104 in the trenches 215 and n-side pad electrodes 107 extending from the outermost trench to the upper surface of the mesa electrode pull-up regions 211 are therefore formed.

The photoresist pattern PR3 is removed and at the same time the metal layers deposited thereon are lifted off. In this manner, the p-side and n-side electrodes are formed on the substrate surface formed with the mesa active regions and mesa electrode pull-up regions. Lower Pt/Rh of the p-side electrode is a lamination mainly aiming to form an ohmic contact with the semiconductor p-type region, and in place of the Pt/Rh layers in contact with and in proximity to the semiconductor surface, an Rh single layer, a Pt/Ag lamination, an Rh/Ag lamination or the like may be used. This lamination is preferably made of a high reflectance material relative to light emitted from the light emission layer 102, forming an ohmic contact with the p-type region. The Ti layer provides a function of an adhesion layer. If continuous vacuum deposition is used, the Ti layer may be omitted. A thickness of each of the upper Pt/Au/Pt/Au layers is determined from the surface state of a semiconductor light emitting device to be used, bonding properties to the support substrate and the like. When the total thickness of the electrode layer is changed, a thickness of the middle Au layer is changed, whereas when bonding properties of eutectic are changed, a thickness of the surface Au layer is selected.

Lower Al/Rh of the n-side electrode is a lamination mainly aiming to form an ohmic contact with the n-type region 101, and in place of the Au/Rh layers, an Al/Pt lamination, an Al/Ir lamination, an Al/Pd lamination and the like may be used. The upper Pt/Au/Pt/Au lamination can be adjusted in the manner similar to the upper lamination of the p-side electrode. When the n-side electrode is formed after the p-side electrode is formed, the n-side electrode can be adjusted slightly higher or lower than the p-side electrode or can be adjusted to have the same level as that of the p-side electrode. For example, if a wafer warps in a convex shape on the epitaxial layer side and the peripheral area becomes lower than the central area, the n-side electrode may be formed slightly higher than the p-side electrode to make both the electrodes position on a flat surface. Conversely, if a wafer warps in a concave shape, the n-side electrode may be formed slightly lower than the p-side electrode.

FIG. 2C is a plan view showing the surface layout of the light emitting device substrate formed with the p-side electrodes 105 and n-side electrodes 104 and 107. A cross sectional view taken along line IIB-IIB corresponds to FIG. 2B. The p-side electrode 105 is formed in a central area of each mesa active region 210, the n-side electrode 104 is formed in the central area of each trench 215, and the n-side pad electrode 107 is formed continuously from the outermost trench to the upper surface of the mesa electrode pull-up region 211. Current is supplied to the n-side electrode 104 from the n-side pad electrode 107 on the surface of the mesa electrode pull-up region in the chip peripheral area, and to each light emitting region via the n-side electrode 104 formed surrounding the mesa active region 210. The p-side electrode 105 is formed directly on the upper surface of each mesa active region to supply current to the light emitting region.

As shown in FIG. 3, an $SiO_2$ layer 106 is deposited to a thickness of 100 to 300 nm by sputtering from the upper position of the substrate. Thereafter, a resist pattern having openings above the p-side electrodes 105 and n-side pad electrodes 107 is formed and the $SiO_2$ layer 106 is wet-etched. In this manner, the surfaces of the p-side electrodes 105 and n-side pad electrodes 107 are exposed. The $SiO_2$ layer 106 functions as a hardly wettable protection film to be described at a later electrode bonding process in order to prevent the bonding material from being made wet. The hardly wettable protection film is a film having a contact angle of 90° or larger. In addition to $SiO_2$, the hardly wettable protection film may be made of $Al_2O_3$, $TiO_2$, $ZrO_2$, $HfO_2$ or the like.

If a Ti layer having a thickness of about 1 to 3 nm is deposited on the surfaces of the p-side electrodes 105 and n-side electrodes 104 and 107, the adhesion to the hardly wettable protection film can be improved. Since the Ti layer is etched at the same time when $SiO_2$ is wet-etched, the Au layer is exposed on the surfaces of the exposed electrodes and pad electrodes. The sapphire substrate light emitting device wafer after the electrodes are formed is ground and polished to thin it to a thickness of about 100 µm. Thereafter, scribing and breading are performed to separate the wafer into individual light emitting device substrates. A light emitting device substrate is formed in this manner.

As shown in FIG. 4A, for example, an Si single crystal substrate is used as a support substrate 200. First, the Si single crystal substrate is washed to clean the surface thereof. An $SiO_2$ layer 201 is deposited to a thickness of 300 nm on the surface of the Si single crystal substrate by sputtering. If an Si substrate formed with a thermally oxidized film is used, the $SiO_2$ layer 201 is not required to be newly formed. If an insulating substrate such as an AlN substrate is used, an insulating protective film is not necessary to be formed on the surface of the substrate.

A photoresist pattern is formed on the substrate surface in an area where wiring is not formed, and a Ti layer having a thickness of 10 nm and an Au layer having a thickness of 1000 nm (1 µm) are deposited by electron beam vacuum deposition. The resist pattern is thereafter removed to lift off the metal layer deposited thereon. In this manner, an n-side wiring layer 202 and a p-side wiring layer 204 are formed. In place of Ti/Au, the wiring layer may also be formed by Ni/Au, Al/Au or the like.

As shown in FIG. 4B, the p-side wiring layer 204 is continuously formed in an area corresponding to the light emission region in the chip central area where the mesa active regions are disposed. The n-side wiring layer 202 is formed having a shape connecting the mesa electrode pull-up regions in the chip peripheral areas.

Reverting to FIG. 4A, a resist pattern is formed which has openings corresponding to contact areas of the light emitting device substrate, and layers are deposited including an Ni layer having a thickness of 10 nm, an Au layer having a thickness of 100 nm, a Pt layer having a thickness of 100 nm, a layer of n stacks of an Au layer having a thickness of 50 to 200 nm and an Sn layer having a thickness of 50 to 200 nm, and an Au layer having a thickness of 50 to 200 nm (these layers are collectively represented by $Ni/Au/Pt/(Au/Sn)_n/Au$). The resist pattern is removed to lift off the metal layers deposited thereon and leave n-side connection members 203 and p-side connection members 205.

The p-side connection member 205 has a shape corresponding to the p-side electrode 105 on the mesa active region of the light emitting device substrate, whereas the n-side connection member 203 has a shape corresponding to the pad electrode 107 on the mesa electrode pull-up region 211 of the light emitting device substrate.

The thicknesses of the Au layer and Sn layer of $(Au/Sn)_n$ of the connection members 203 and 205 can be determined from an eutectic temperature and an eutectic process. For example, a thickness of the Au layer is set to 75.6 nm, a thickness of the Sn layer is set to 109.3 nm and the number n of repetitions is set to 5.

If a lamination structure is deposited and thereafter an eutectic process is executed, a better reliability is retained than eutectic metal is deposited initially. If the composition ratio of Au and Sn after melting is Au:Sn =80:20 (wt. %) (also expressed by Au/20Sn), a height ratio is 0.544:0.456.

In the above-described structure, the number of Au layers on the support substrate is n+1, the number of Sn layers is n, and the total number of Au layers is n+2 because the Au layer exists on the outermost surface of the electrode layer of the light emitting device substrate.

As shown in FIGS. 5A and 5B, the light emitting device turned upside down is flip-chip bonded on the support substrate. The p-side connection members 205 face the p-side electrodes 105 of the light emitting device substrate, and the n-side electrodes 107 on the mesa electrode pull-up regions face the n-side connection members 203.

The light emitting device substrate and support substrate are bonded by an eutectic bonding apparatus. First, position alignment of electrode patterns is performed between the light emitting device substrate and support substrate. Next, the substrates are made in pressure contact at a pressure suitable for eutectic. Lastly, the substrates are bonded together through heating, maintaining and cooling at a proper eutectic temperature profile. If the eutectic composition is Au/20Sn (Wt %), eutectic bonding is performed at 280° to 330° C.

FIG. 5C is a plan view showing the laminated state of the light emitting device substrate and support substrate as viewed from an upper position. A cross sectional view taken along line VA-VA corresponds to FIG. 5A, and a cross sectional view taken along line VB-VB corresponds to FIG. 5B. A bonding region is reserved to the right of the light emitting device substrate, an n-side wire 251 is bonded to the n-side wiring layer 202 and a p-side wire 252 is bonded to the p-side wiring layer 204.

A completed light emitting device is adhered to, for example, a frame, a wiring board, a heat sink, a stem or the like. For adhesion, Ag paste, solder, eutectic or the like may be used. Roughness of the polished surface of the support substrate may be adjusted depending upon use applications. For example, if Ag paste is to be used for adhesion, adhesion properties are good if the ground or polished surface of the support substrate is more or less rough. If solder or eutectic is to be used for adhesion, a mirror surface is preferable because a Cu layer, an Ag layer, an Au layer and/or an Sn layer are formed on the ground and polished surface.

According to this embodiment, the broad p-side electrode 105 is formed on the upper central surface of each mesa active region 210 and contacts the p-side connection member 205 so that associated parasitic resistance of the p-side electrode can be maintained low. Since the n-side electrode is formed on the surfaces of the trenches, surrounding the mesa active regions, current can be supplied from the whole circumferential area with a low associated parasitic resistance. Since the n-side electrode 104 is wired in a lattice shape, a high redundancy can be retained and even if a breakdown occurs, its damages can be suppressed. The n-side pad electrode 107 is pulled up to the upper surface of the mesa electrode pull-up region 211 having the same height as that of the mesa active region 210. Therefore, the same layer structure can be applied to the n-side connection member 203 and p-side connection member 205, resulting in a simplified manufacture process. The total resistance of the n-side wiring can also be maintained low.

Referring to FIG. 5A, light L1 emitted upward from the light emission layer 102 transmits through the n-type layer 101 and transparent substrate 100 and is output upward. Light L2 emitted downward from the light emission layer 102 is reflected upward at the surface of the p-side electrode 105, transmits through the n-type layer 101 and transparent substrate 100, and is output upward. In this manner, light emitted from the light emission layer 102 is efficiently output upward.

A design example of the lamination structure for forming eutectic will be described as below.

<Structure>
Connection member layer: $(Au/Sn)_n/Au$
Pad electrode surface layer: Au
Number of repetitions: n
<Total Number>
Number of Au layers: n+2
Number of Sn layers: n
<Total Thickness>
Au height ratio: Dau (0.544 for Au/20Sn)
Sn height ratio: Dsnu (0.456 for Au/20Sn)
Note: since tin formed by sputtering was confirmed as grey tin, the height ratio was calculated at the density of 5.76 g/cm³.

Au film thickness: Lau=Lt*Dau/(n+2)
Sn film thickness: Lsn=Lt*Dsn/n
Eutectic member film thickness: Lst=Lau*(n+1)+Lsn*n
Pad surface Au thickness: Lpd=Lau For example, assuming that the total thickness of an eutectic metal layer is 1200 nm and the number of repetitions is 5, there are seven Au layers with a single Au layer thickness of 93.3 nm. There are five Sn layers and each layer has a thickness of 109.3 nm. Therefore, the total thickness of the connection member is set to 1106.7 nm and the minimum thickness of the electrode surface Au layer of the confronting light emitting device substrate is set to 93.3 nm or thicker.

In order to further improve bonding, the minimum thickness of the electrode surface Au layer of the confronting light emitting device substrate was fixed to 200 nm. The thickness of each layer is therefore as in the following.

Total thickness: Lt=1200 nm
Pad surface Au thickness: Lpd=200 nm
Number of repetitions: n=5
Au thickness of eutectic member: Laust=(Lt*Dau−200)/(n+1)≈75.6 nm
Sn thickness of eutectic member: Lsnst=Lt*Dsn/n≈109.3 nm
Eutectic member thickness: Lst=Laust*(n+1)+Lsnst*n≈453.6 nm+546.5 nm≈1000 nm As described above, if the Sn ratio of the connection member is set apparently larger than the eutectic ratio, the bonding is improved because when the connection member is melted, the Au layer on the electrode layer surface of the confronting light emitting device substrate is melted.

The following advantages can be obtained by the embodiment described above.

(1) The structure that light emitting surfaces are densely disposed in a central area in an array shape and the n-side electrode pads are disposed in an outer circumference area, can provide a high light emission luminance and can realize a spot-like light emission as a whole as viewed from an external.

(2) Since the functions of the n-side ohmic electrode and n-side electrode pads are separated, the width of the n-side ohmic electrode occupying the light emission surface can be made as narrow as possible so that the luminance distribution in the light emission surface can be made uniform.

(3) Although the whole light emission surface area is made broad, current can be supplied uniformly to all partitioned mesa active regions. The lattice type electrode structure can suppress wiring defects such as breakdown.

(4) Since a plurality of n-side electrode pads can be disposed in the device outer peripheral area, bonding defects to the support substrate can be suppressed.

(5) The hardly wettable protection film allows the whole light emission surface to be bonded to the support substrate. A high heat radiation can be realized resulting in high injection current and high output.

(6) The structure of the lattice type n-type ohmic electrode wiring and a plurality of n-type electrode pads disposed in an outer peripheral area considerably improve the redundancy against power feeding failures.

(7) The p-type ohmic electrodes (p-side electrode pads) disposed on the rectangular n×m mesa active regions considerably improve the bonding to the connection members of the support substrate.

(8) Since the hardly wettable protection film covers the area other than the p-type ohmic electrodes (p-side electrode pads) and n-side electrode pads, the connection members can have the functions of self coverage, area keeping and self pull-up.

A semiconductor light emitting device of ultra high luminance and ultra high output can be realized in this manner. High reliability and long lifetime are possible and a stable manufacture method can be provided.

In the above-described embodiment, it has been described that the mesa electrode pull-up region may be used as a position alignment mark. A position alignment mark may be formed positively.

Figure 6A:
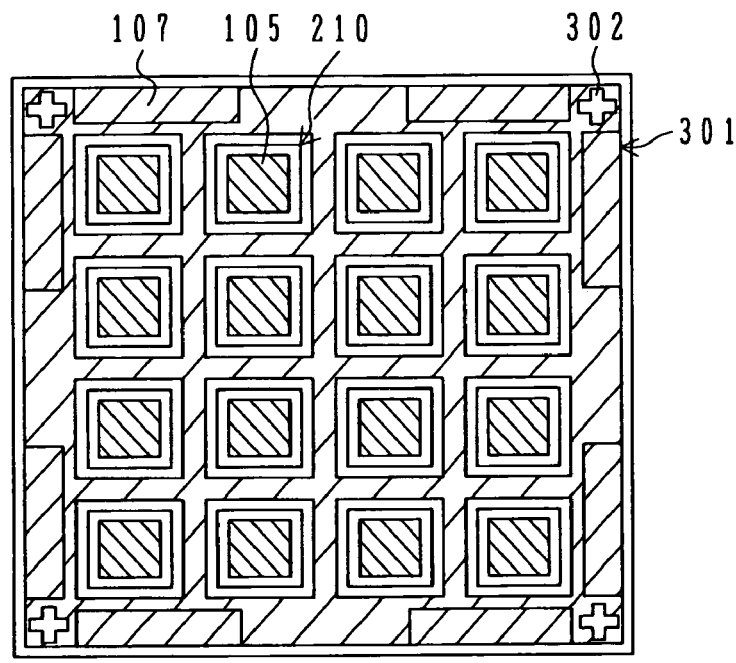
FIGS. 6A and 6B are plan views illustrating the semiconductor light emitting device according to a modification of the first embodiment.
Figure 6B:
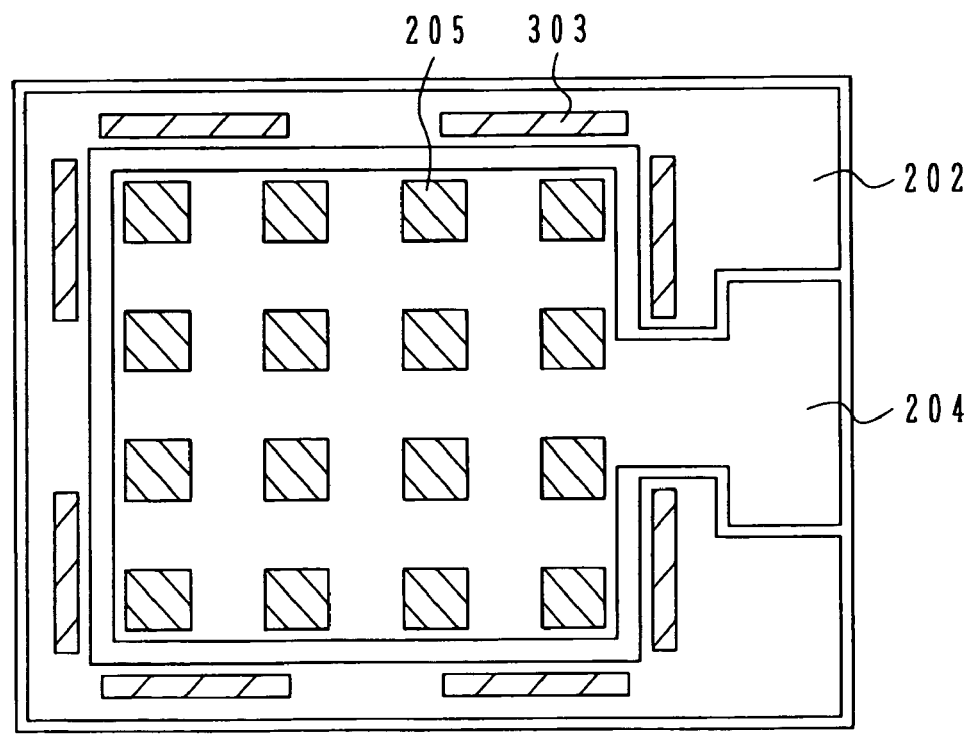

FIGS. 6A and 6B show modifications of a position alignment mark. FIG. 6A is a plan view of a light emitting device substrate corresponding to FIG. 2C, and FIG. 6B is a plan view of a light emitting device substrate corresponding to FIG. 4B. A mesa electrode pull-up region 301 is not of an L-character shape but of a shape removing the corner. In the recess area at the corner, the n-side electrode is not formed but an extrusion pattern 302 is formed to use this as a position alignment mark. The support substrate shown in FIG. 6B has connection members 303 having a shape corresponding to the mesa electrode pull-up region 301. The support substrate having the structure shown in FIG. 4B may also be used.

In order to form a position alignment mark on the light emitting device substrate, dry etching is performed by using a resist mask having an opening corresponding to the area where a position alignment mark at the corner is to be formed, and vacuum deposition and lift-off for n-side electrodes are performed by using a resist mask having an additional cross shape in an area where the position alignment mark is to be formed.

The position alignment marks 302 at four corners have preferably a shape extending in different directions in an X-Y plane and having a cross point, such as a cross mark and a L-character mark. A polygon or circle having a diameter of about 100 μm to 500 μm may also be used. By using the position alignment marks, the position of the light emitting device can be detected correctly with a camera of an eutectic bonder in the eutectic process for bonding the light emitting device substrate and support substrate, and the light emitting device can be bonded to the support substrate at a good position precision. If the light emitting device substrate has a transparent substrate and a transparent semiconductor deposition layer formed thereon, it is possible to detect and determine the position of the light emitting device substrate from the substrate side opposite to the electrode side.

In the first embodiment, the mesa active regions are disposed in the light emission area in a matrix shape, and the mesa electrode pull-up regions are disposed at the corners outside of the light emission area. The layout of the mesa regions is not limited only thereto.

Figure 7A:
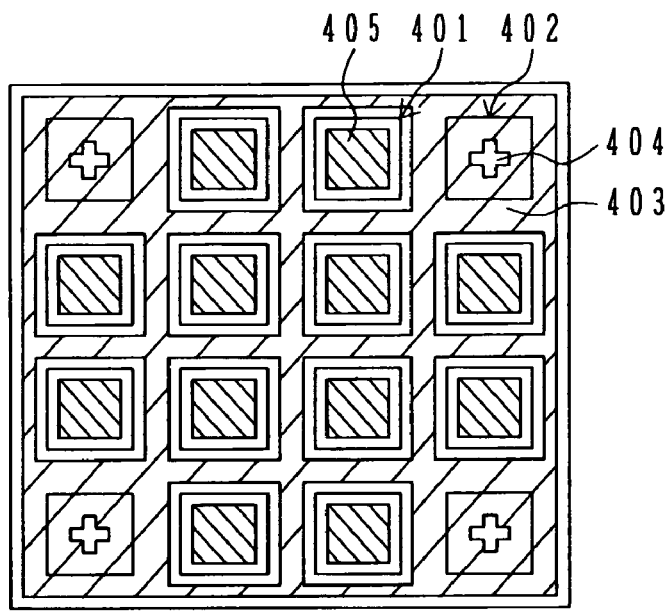
FIGS. 7A and 7B are plan views illustrating a semiconductor light emitting device according to a second embodiment.
Figure 7B:
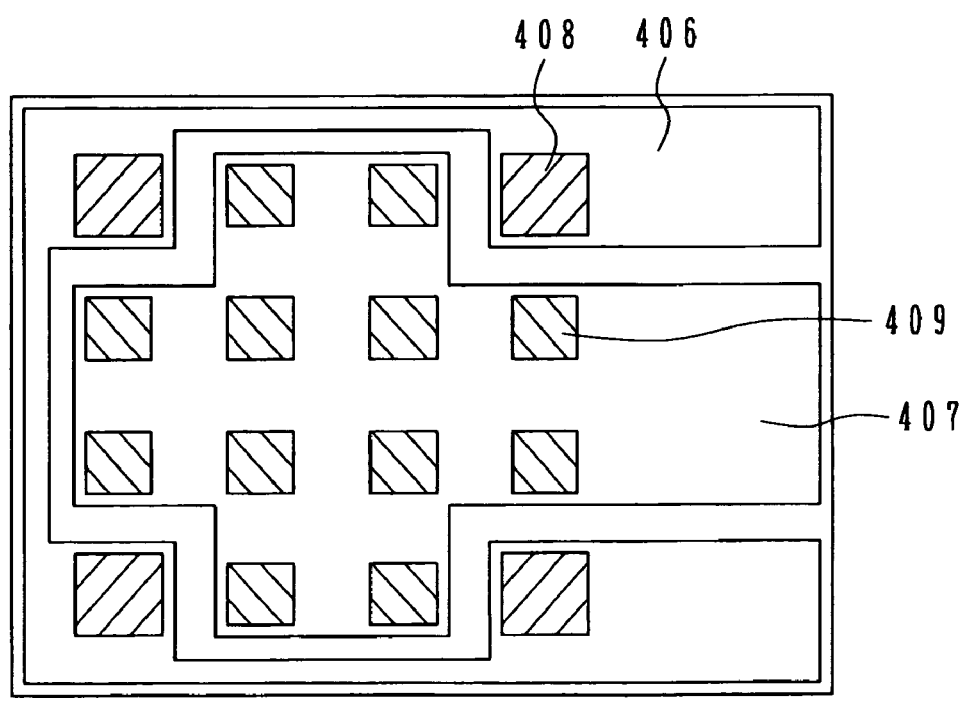

FIGS. 7A and 7B show the second embodiment of the invention. As shown in FIG. 7A, mesa active regions 401 and mesa electrode pull-up regions 402 have the same rectangular plan shape, and are disposed in a rectangular area in a matrix shape. Similar to the first embodiment, the region other than the mesa regions is subjected to reactive etching to form recess regions exposing the n-type nitride semiconductor layer. An n-side electrode 403 is formed which extends from the n-type nitride semiconductor layer in the recess regions to the upper surface of mesa electrode pull-up regions 402 at four corners, and p-side electrodes 405 are formed on the p-type nitride semiconductor layer of the mesa active regions 401. Position alignment cross marks 404 are formed on the n-side electrode 403 of the mesa electrode pull-up regions 402 at four corners.

FIG. 7B shows the plan shape of a support substrate. Formed on a silicon substrate having an insulating surface are an n-side wiring layer 406 having a pattern to be connected to the mesa electrode pull-up regions at four corners and a p-side wiring layer 407 having a pattern to be connected to the mesa active regions 401. Connection members 408 and 409 are formed on the n-side wiring layer 406 and p-side wiring layer 407 respectively to be connected to the pad electrodes on the mesa electrode pull-up regions 402 and the p-side electrodes on the mesa active regions 401. A protection film is formed exposing the p-side electrodes 405 and the pads of the n-side electrode 403.

The other structures and manufacture processes are similar to those of the first embodiment.

In this embodiment, mesa portions at four corners of the rectangular area are used as the electrode pull-up regions, and n-side electrode pads are formed thereon. The positions of n-side pad electrodes are not limited to four corners. The support substrate may have a size corresponding to one light emitting device substrate or a size allowing a plurality of light emitting devices to be mounted thereon. The support substrate itself may be a stem, a horn type stem, a wiring board or the like.

Mesa regions are not limited to be disposed only in a matrix shape. If the number of mesa active regions is small, the plan shape of each mesa active region may be changed in various ways. The hardly wettable protection film is not limited to be formed only on the light emitting device substrate.

FIGS. 8A to 8E show the third embodiment. In this embodiment, a hardly wettable protection film is formed on both the light emitting device substrate and support substrate, the number of mesa active regions is set to 2, and the shape of the mesa active region and mesa electrode pull-up region is rectangular.

Figure 8B:
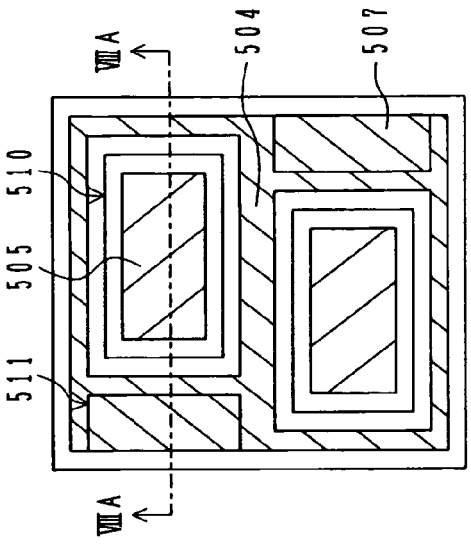
FIGS. 8A to 8E are cross sectional views and plan views illustrating a semiconductor light emitting device according to a third embodiment.
Figure 8D:
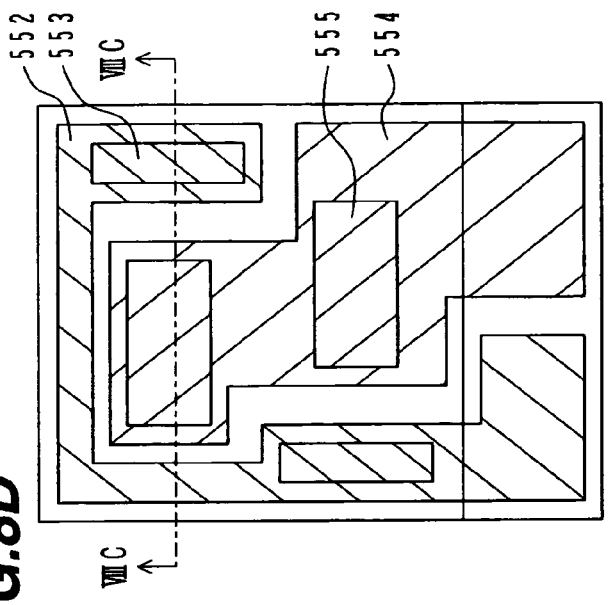
Figure 8A:
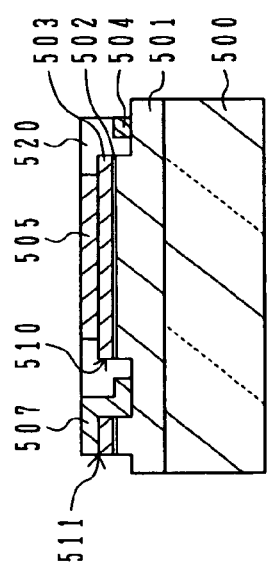

FIGS. 8A and 8B are a cross sectional view and a plan view of the light emitting device substrate. Similar to the above-described embodiments, stacked on a transparent single crystal substrate 500 are an n-type layer 501, a light emission layer 502 and a p-type layer 503 respectively made of GaN series nitride semiconductor. A region other than mesa regions are etched by reactive ion etching to leave mesa active regions 510 and mesa electrode pull-up regions 511.

By using a photoresist mask, electron beam vacuum deposition and lift-off, on the n-type layer 501 exposed in the recess area, an n-side ohmic electrode 504 is formed which continuously extends to the upper surface of the mesa electrode pull-up regions 511 to form n-side pad electrodes 507. On the p-type layers 503 of the mesa active regions 510, p-side ohmic electrodes 505 are formed. An $SiO_2$ film 520 is formed covering the n-side ohmic electrodes and covering the surface between the p-side ohmic electrode 505 and n-side pad electrode 507.

Figure 8C:
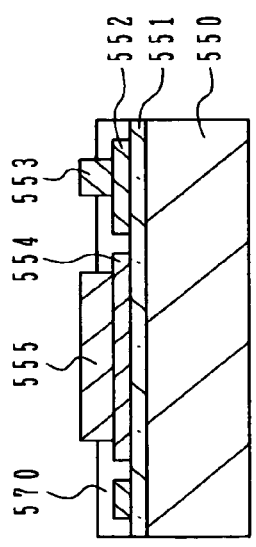

FIGS. 8C and 8D are a cross sectional view and a plan view of the support substrate. On a silicon substrate 550 having an insulating layer 551, by using a photoresist mask, electron beam vacuum deposition and lift-off, an n-side wiring layer 552 and a p-side wiring layer 554 are formed, and n-side connection members 553 and p-side connection members 555 are formed having the shapes corresponding to those of the mesa regions. An $SiO_2$ film 570 is formed covering the n-side wiring layer 552 and p-side wiring layer 554 and covering the surface between the n-side connection member 553 and p-side connection member 555. In this manner, the hardly wettable protection film is formed on both the light emitting device substrate and support substrate.

Figure 8E:
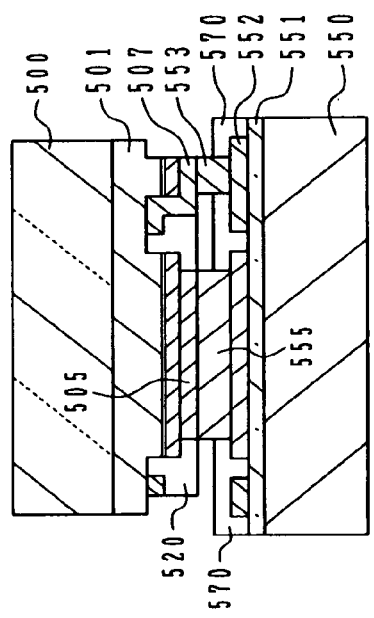

As shown in FIG. 8E, the light emitting device substrate is flip-chip bonded to the support substrate. The electrodes 505 and 507 of the light emitting device substrate are aligned in position with the connection members 555 and 553 of the support substrate, and eutectic is formed through pressing and heating. The other points are similar to those of the above-described embodiments.

Since the hardly wettable film is formed on both the light emitting device substrate and support substrate, a melting area of the connection member is perfectly regulated in the bonding process, good bonding is possible even if a distance between electrodes is as narrow as about several µm.

In the first and second embodiments, the n×m rectangular active regions are defined by lattice-like recesses (partitioning grooves) and the p-type ohmic electrodes are formed in these regions. A thickness of the connection member as a thermal resistance member is made very thin about 0.3 µm to 3 µm in order to regard the heat radiation important. In the following, description will be made on the functional advantages of bonding between the p-side ohmic electrode (also functioning as the p-side electrode pad) finely divided into n×m and the p-side connection member of the support substrate.

For example, if a drive voltage is 3.3 V when current of 350 mA is flowed into the device having a size of 1 $mm^2$ and an external quantum efficiency is 15%, then a heat flow density is about 98 k ($W/m^2$) assuming that energy other than light emission is simply changed to heat. Namely, since a large current device has a large calorific value, it is important to sufficiently release the heating value generated by the light emitting device in order to obtain the device performance effectively.

In a flip-chip type semiconductor light emitting device, heat generated in the device is conducted and radiated in the order of p-type ohmic electrode→p-side conduction member→p-side lead electrode→support substrate→device mount portion (such as a frame, a stem, a wiring board and a heat sink). It is herein assumed that bonding and heat radiation during bonding the support substrate and device mount portion are satisfactory, and only the bonding state between the support substrate and the light emitting device on the light emitting device substrate will be studied.

Figure 10A:
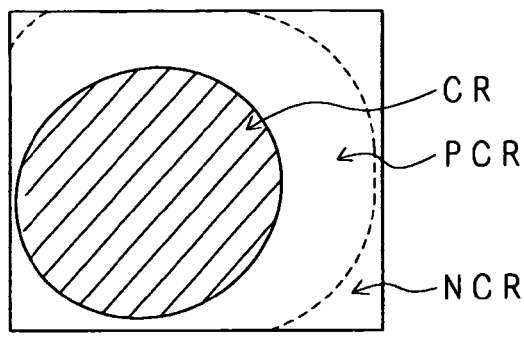
FIGS. 10AH and 10BH and FIGS. 10AV and 10BV are plan views and cross sectional views illustrating the relation between a load and a bonding area.
Figure 10B:
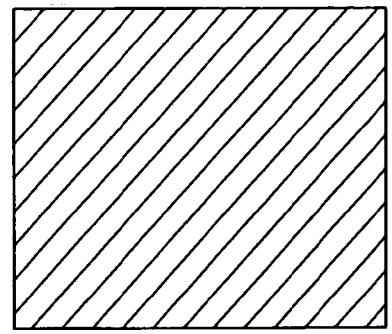
Figure 10A:
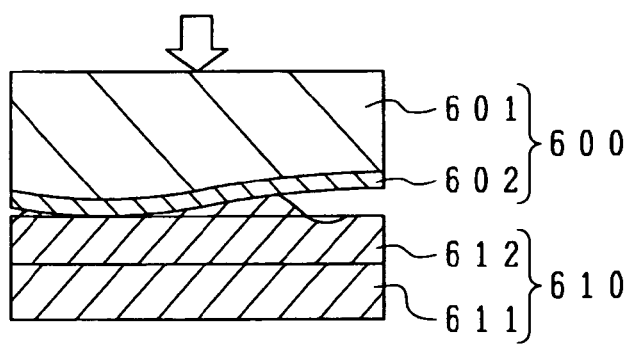
Figure 10B:
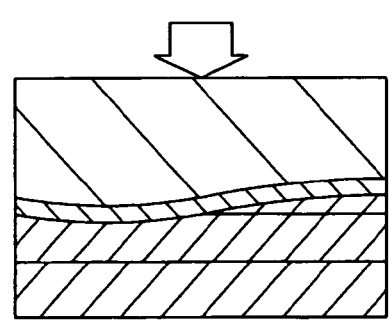

FIGS. 9AH, 9AV to FIGS. 10BH, 10BV illustrate bonding processes. In the drawing symbols, H represents a plan view and V represents a vertical cross sectional view. After the support substrate and light emitting diode substrate are aligned in position by using an eutectic bonder, they are brought into pressure contact with each other. A light emitting device 600 has a p-type ohmic electrode layer 602 formed on a p-type GaN layer 601. The support substrate 610 has a connection member layer 612 formed on a p-side lead electrode layer 611.

Next, as the substrates are heated, melting starts so that melting and eutectic start from a contact point CP shown in FIGS. 9AH and 9AV. Bonding and eutectic progress in the order of FIGS. 9BH and 9BV, FIGS. 9CH and 9CV, and FIGS. 9DH and 9DV. During the progress of bonding, the melted connection member 612 flows into a contact (bonding) region CR so that a non-contact (non-bonding) or poor-contact region PCR where the connection member becomes short is formed outside the contact region CR. Therefore, as shown in FIGS. 10AH and 10AV, only a partial area is bonded at a load smaller than a proper load. However, as shown in FIGS. 10BH and 10BV, at the proper load, there is no poor-contact (or non-bonding) region PCR so that the p-type ohmic electrode (p-side electrode pad) and support substrate are bonded over the whole area by the connection member.

With reference to FIGS. 11A to 11D, a designed contact region or bonding area and an actual contact region or bonding area will be described. In each drawing, the upper side shows a plan view and the lower side shows a cross sectional view. FIGS. 11A to 11C shows the examples having electrode areas EA of 0.4, 0.2 and 0.1 mm$^2$, respectively. A surface (surface of a p-type nitride semiconductor layer) of a semiconductor light emitting device wafer has a roughness of about 10 nm to 30 nm, and of about 70 nm to 100 nm in a larger case. This roughness is reflected upon the surface of a p-type ohmic electrode layer (p-side electrode pad) 602. A warp of the roughness as viewed horizontally has a period of about several µm to several hundreds µm.

In an actual bonding process, this roughness concentrates the eutectic material upon a region where melting and bonding start so that even a load is exerted, it is not possible to remove the poor-contact or non-bonding region PCR.

This phenomenon did not occur if the p-type ohmic electrode (p-side electrode pad) 602 had the electrode area EA narrower than about 0.1 mm$^2$ (300 µm square) as shown in FIG. 11C, sporadically occurred from the p-type ohmic electrode area of about 0.2 mm$^2$ as shown in FIG. 11B, and occurred frequently at the electrode area of about 0.4 mm$^2$ as shown in FIG. 11A.

If an unnecessarily large load is exerted, the p-type ohmic electrode on the convex surface may be damaged so that the ohmic characteristics are degraded or a reflectance is lowered, leading to a degraded performance of a finished device. From this reason, the problem is not solved only by the load.

The trench width cannot be made narrower than a certain width. Therefore, if the size of the p-type ohmic electrode (p-side electrode pad) is made extremely small, the rectangular area (light emission area) of the mesa active regions becomes small relative to the device size, which is a disadvantage in terms of the light emission output. Therefore, a realistic size is about 0.01 mm$^2$ or broader. Since the contact or bonding area broadens in a circular shape, the shape of the p-type ohmic electrode (p-side electrode pad) is preferably circular. However, since the light emission area loss becomes large, the proper shape is square.

FIGS. 11A and 11B show the examples that although the electrical connection is obtained, the design contact region or bonding area cannot be obtained. Since the bonding area is narrow, necessary heat radiation toward the support substrate cannot be achieved so that thermal deterioration occurs at an earlier stage. Such defective devices cannot be detected by a visual inspection (light emission characteristics) so that thermal resistance measurements of all devices and aging tests are desired. This is a disadvantage from the viewpoint of mass production, cost and reliability. In contrast, the device shown in FIG. 11C is excellent from the viewpoint of mass production, cost and reliability.

For a large area semiconductor light emitting device such as shown in FIG. 11A, the connection member 612 or bumps BP shown in FIG. 11D are often used for bonding. The bump has a thickness of about 30 µm to 50 µm at the minimum so that the thermal resistance becomes large and heat radiation is degraded.

As the size of the p-type ohmic electrode (p-side electrode pad) 602 is set to 0.2 mm$^2$ or smaller, the poor-contact or non-bonding region can be eliminated effectively and the bonding properties are either the whole area bonding or the non-bonding. Namely, since the intermediate bonding state such as shown in FIGS. 11A and 11B is eliminated, the device rated current can be determined only by checking the number of partitioned light emission areas by a visual inspection. This tendency becomes distinctive if the size is set to 0.1 mm$^2$ or smaller.

Figure 12C:
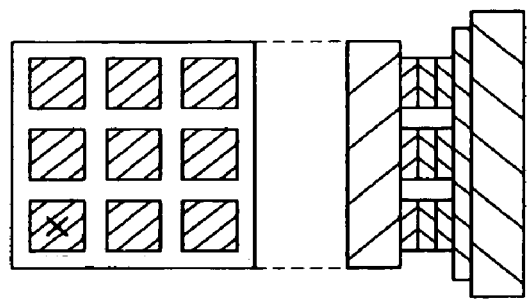
FIGS. 12A to 12C are plan views and cross sectional views illustrating the relation between a light emitting section and a rated current.
Figure 12B:
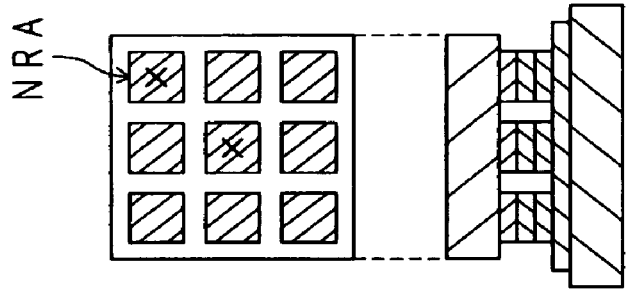
Figure 12A:
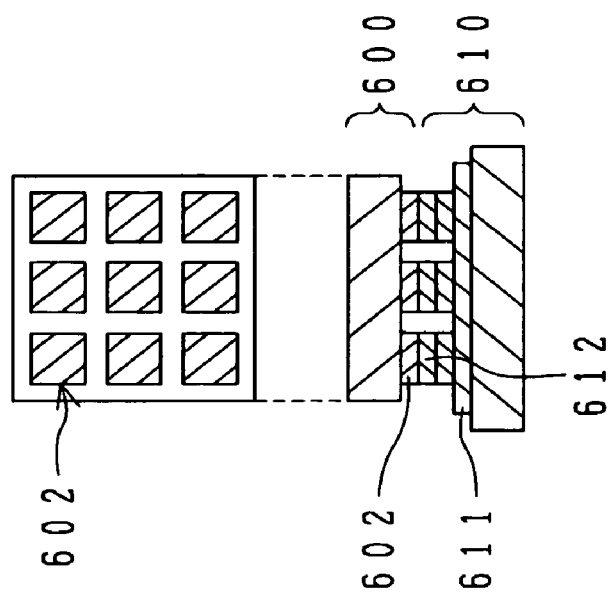

It is assumed that the device having nine partitioned areas of active regions as shown in FIG. 12A-12C has a rated current of 360 mA. As shown in FIG. 12B, if the inspection indicates seven areas of light emission and two non-light emission or non-radiative areas NRA, the rated current can be determined as 280 mA. If the inspection indicates eight areas of light emission as shown in FIG. 12C, the rated current can be determined as 320 mA.

Although the devices having the configuration shown in FIGS. 11A and 11B should be determined as defective devices, if the size of the n×m p-type ohmic electrodes (p-side electrode pads) is set to 0.2 mm$^2$ or smaller, the rated current can be determined readily in accordance with the number of light emission areas so that the devices can be used as non-defective devices at different ranks.

In the structure of the first embodiment, the n×m rectangular mesa active regions are defined by lattice-like partitioning grooves and the p-type ohmic electrodes are formed in these regions, the hardly wettable protection film is formed on the substrate surface excepting the p-type ohmic electrodes (p-side electrode pads) and n-side electrode pads, and a thickness of the connection member as a thermal resistance member of the support substrate is made very thin about 0.3 µm to 3 µm in order to regard the heat radiation important. In the following, description will be made on the functional advantages of bonding.

Figure 13A:
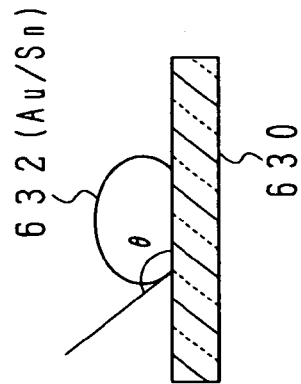
FIGS. 13A to 13C are cross sectional views and a diagram illustrating a contact angle and a surface tension (boundary tension).
Figure 13B:
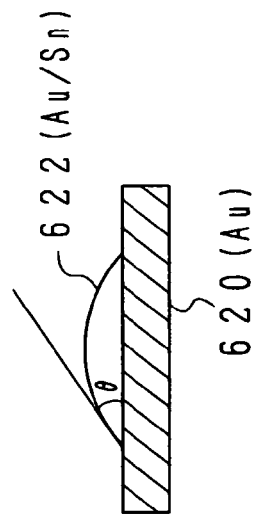
Figure 13C:
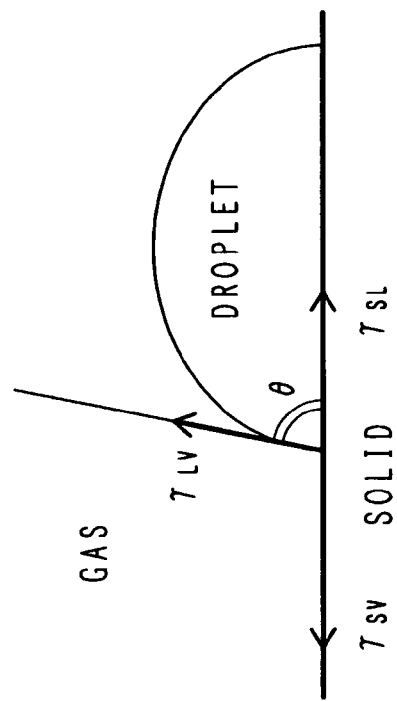

FIGS. 13A and 13B illustrate wettability at the temperature (near 300° C.) at which the connection member (Au/20Sn) melts. As shown in FIG. 13A, a contact angle θ of a connection member 622 relative to an Au plate 620 is small and wettability is good. As shown in FIG. 13B, the contact angle θ of a connection member 632 relative to a glass plate 630 is large and wettability is bad and the connection member enters the so-called ball-up state. These relations can be explained by a contact angle and a surface tension (interface tension) shown in FIG. 13C and the relation therebetween is indicated by the equation (1).

Namely, if the connection member and a contact surface are wettable, the melted connection member is easy to spread on the contact surface, whereas if they are not wettable, the melted connection member does not spread.

Figure 14A:
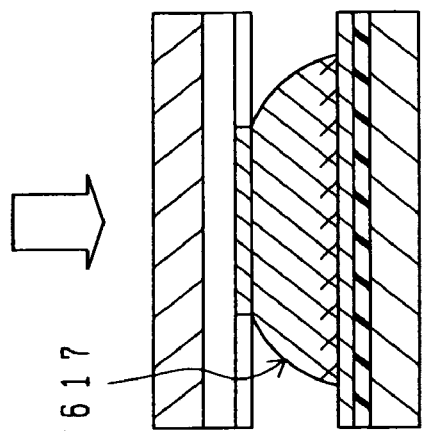
FIGS. 14A to 14C are cross sectional views illustrating a hardly wettable protection film.
Figure 14B:
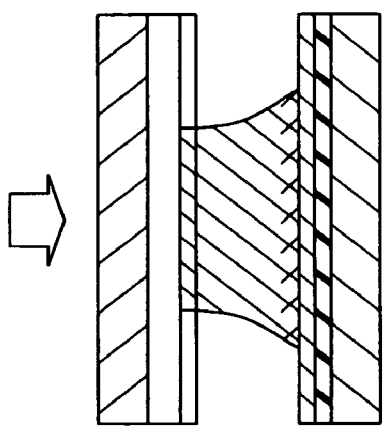

With reference to FIGS. 14A and 14B, an actual bonding processes will be described. A semiconductor light emitting device substrate 600 has a substrate 604 on which a nitride semiconductor layer 605 and an electrode pad 606 are stacked, and a hardly wettable protection film 607 surrounds the electrode pad. A support substrate 610 has a substrate 614 on which an insulating film 615, and a lead electrode 616 are stacked. A connection member 617 is disposed on the lead electrode 616 and faces the electrode pad 606. First, as shown in FIG. 14A, the electrode pad (Au) 606 of the light emitting device substrate having a size slightly larger than the connection member is pushed against the connection member (Au/20Sn) 617 disposed on the lead electrode (Au) 616 of the support substrate 610. Thereafter, the substrates are heated to about 300° C. at which eutectic melts so that the connection member stars melting. At this time, the connection member 617 made of Au/20Sn (wt %) spreads (becomes wettable) on the surface of the lead electrode 616 made of Au and both the materials are partially mixed at the interface therebetween. An Au-rich layer having a high viscosity is therefore formed and the spread of the connection member is suppressed. The connection member 617 in contact with the electrode pad 606 made of Au of the light emitting device substrate spreads (becomes wettable) on the electrode pad 606 and stops (self coverage) at the boundary of the hardly wettable protection film 607.

As shown in FIG. 14B, with the above processes, the support substrate and connection member are bonded. The shape of the connection member during bonding is determined from the balance of the interface tensions at the boundaries between the lead electrode 616 and connection member 617, between surrounding gas and the connection member 617 and between the electrode pad 606 and connection member 617, an aggregation force, viscosity and the like of the connection member 617.

Figure 14C:
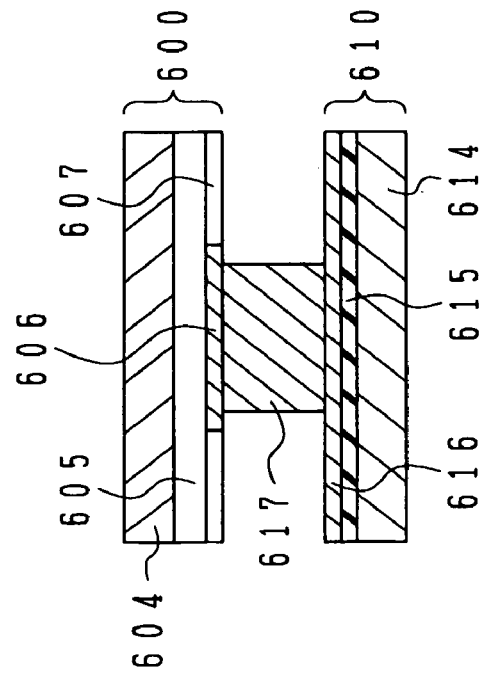

As shown in FIG. 14C, as a larger load is exerted, a force of expanding the connection member 617 is exerted on the boundary between the electrode pad and connection member. However, the connection member 617 remains (area keeping) in the electrode pad because of the hardly wettable protection film, although the contact angle of the connection member becomes large.

In another case, if there is a small misalignment between the support substrate and light emitting device substrate and the connection member extends on the surface of the protection film surrounding the electrode pad, the connection member is retracted (self pull-up) within the electrode pad during melting because of the interface tension.

More specifically, if a protrusion of the connection member from the electrode pad end is about 5 to 15 μm, the hardly wettable protection film 607 expels the connection member 617 during melting and bonding and the connection member is retracted within the electrode pad 606. The protrusion amount capable of being retracted changes because the reacting interface tensions change with the quality and surface state of the electrode pad 606, hardly wettable protection film 607 and connection member 617. When the protrusion retraction effect is considered, the hardly wettable protection film 607 is required to cover the width about a twofold to threefold of the estimated protrusion width from the electrode pad end.

The above-described functions can be achieved under the conditions that the electrode pad has an area of 0.1 $mm^2$ to 0.2 $mm^2$ and the thickness of the connection member is 0.3 μm to 3 μm. By surrounding the electrode pad with the hardly wettable protection film, the connection member can be bonded to the whole surface of the electrode pad, and it is possible to realize stable electrical connection and heat radiation to the support substrate as designed.

The present invention has been described in connection with the preferred embodiments. The invention is not limited only to the above embodiments. It will be apparent to those skilled in the art that other various modifications, improvements, combinations, and the like can be made. The structure of the invention is applicable to semiconductor light emitting diodes (LED) and white LED.

The invention claimed is:

1. A semiconductor light emitting device comprising:
   a transparent substrate;
   a first conductivity type nitride semiconductor layer formed above said transparent substrate;
   a nitride semiconductor light emission layer formed above said first conductivity type nitride semiconductor layer;
   a second conductivity type nitride semiconductor layer formed above said nitride semiconductor light emission layer, the second conductivity type being opposite to the first conductivity type;
   recess regions extending through said second conductivity type nitride semiconductor layer and said nitride semiconductor light emission layer and extending through a partial thickness of said first conductivity type nitride semiconductor layer to expose said first conductivity type nitride semiconductor layer at bottoms of the recess regions, said recess regions defining a plurality of mesa active regions and mesa electrode pull-up regions, each of said mesa active regions and said mesa electrode pull-up regions comprising a portion of said first conductivity type nitride semiconductor layer, a portion of said nitride semiconductor light emission layer, and a portion of said second conductivity type nitride semiconductor layer;
   a first electrode including a first ohmic electrode portion formed on said first conductivity type nitride semiconductor layer in said recess regions surrounding said plurality of mesa active regions, and first pad electrode portions that are continuous with said first ohmic electrode portion and that extend to said mesa electrode pull-up regions;
   a second ohmic electrode formed on the portion of said second conductivity type nitride semiconductor layer of each of said plurality of mesa active regions; and
   a support substrate disposed opposite to said transparent substrate, said support substrate including first conductive connection members connected to and facing said first pad electrode portions and second conductive connection members connected to and facing said second ohmic electrodes.

2. The semiconductor light emitting device according to claim 1, wherein said plurality of mesa active regions are disposed in a matrix shape in a light emission area, and said mesa electrode pull-up regions are disposed in a plurality of areas outside of said light emission area.

3. The semiconductor light emitting device according to claim 1, wherein each of said mesa active regions has a rectangular plan shape.

4. The semiconductor light emitting device according to claim 3, wherein said recess regions include two groups of recess grooves crossing perpendicular to each other.

5. The semiconductor light emitting device according to claim 1, wherein said light emission area has a shape of a rectangle and said mesa electrode pull-up regions are disposed in areas outside of said rectangle, and are not formed in areas corresponding to central areas of respective sides of said rectangle.

6. The semiconductor light emitting device according to claim 5, wherein said mesa electrode pull-up regions are disposed outside of and near vertexes of said rectangle and each has an L-character plan shape.

7. The semiconductor light emitting device according to claim 5, wherein said mesa electrode pull-up regions are disposed outside of said rectangle, are not formed in areas near each vertex of said rectangle, and are not formed in areas corresponding to central areas of respective sides of said rectangle, and wherein each of said mesa electrode pull-up regions has a rectangular plan shape.

8. The semiconductor light emitting device according to claim 5, wherein said support substrate includes a first wiring layer corresponding to said first conductive connection members, and a second wiring layer which connects said second conductive connection members and which is provided in an area facing a central area of one side of said rectangular light emission area and extending outside of the light emission area.

9. The semiconductor light emitting device according to claim 1, wherein said mesa active regions and said mesa electrode pull-up regions are disposed on said transparent substrate in a matrix shape.

10. The semiconductor light emitting device according to claim 9, wherein said recess regions include two groups of crossing elongated recess regions.

11. The semiconductor light emitting device according to claim 9, wherein said mesa active regions and said mesa electrode pull-up regions have a same plan shape.

12. The semiconductor light emitting device according to claim 11, wherein said mesa active regions and said mesa electrode pull-up regions are disposed in a rectangular area in a matrix shape.

13. The semiconductor light emitting device according to claim 12, wherein said mesa electrode pull-up regions are disposed at corners of said rectangular area.

14. The semiconductor light emitting device according to claim 1, wherein each of said mesa electrode pull-up regions includes a position alignment mark formed by a region not forming one of said first pad electrode portions.

15. The semiconductor light emitting device according to claim 14, wherein said position alignment mark includes at least two straight portions disposed along crossing directions.

16. The semiconductor light emitting device according to claim 14, wherein said position alignment mark is one of a polygon and a circle having a diameter of 100 μm to 500 μm.

17. The semiconductor light emitting device according to claim 1, wherein each of said mesa active regions has an area of 0.01 mm$^2$ to 0.2 mm$^2$.

18. The semiconductor light emitting device according to claim 1, wherein a thickness of said first conductive connection members and said second conductive connection members is 0.3 μm to 3 μm.

19. The semiconductor light emitting device according to claim 1, wherein said first conductive connection members and said second conductive connection members of said support substrate include a metal layer having a high affinity with solder bonding or eutectic bonding.

20. The semiconductor light emitting device according to claim 1, further comprising a protection film disposed above said transparent substrate, exposing said first pad electrode portions and said second ohmic electrodes and covering said first ohmic electrode portion in said recess regions, said protection film being hard to become wettable to said conductive connection members.

21. The semiconductor light emitting device according to claim 1, wherein said support substrate has a protection film surrounding each of said first conductive connection members and said second conductive connection members, said protection film being hard to become wettable to said conductive connection members.

22. A method of manufacturing the semiconductor light emitting device of claim 1, said method comprising:
  (a) preparing a light emitting device substrate having said transparent substrate, above which said first conductivity type nitride semiconductor layer, said nitride semiconductor light emission layer and said second conductivity type nitride semiconductor layer are formed;
  (b) selectively etching a whole thickness of said second conductivity type nitride semiconductor layer and said nitride semiconductor light emission layer and the partial thickness of said first conductivity type nitride semiconductor layer to form said recess regions which define said plurality of mesa active regions and said mesa electrode pull-up regions;
  (c) forming said first electrode, including said ohmic electrode portion in ohmic contact with said first conductivity type nitride semiconductor layer in said recess regions and said first pad electrode portions to extend onto respective ones of said mesa electrode pull-up regions from said the first ohmic electrode portion on said first conductivity type nitride semiconductor layer exposed in said recess regions surrounding said mesa active regions;
  (d) forming one of said second ohmic electrodes in ohmic contact with the portion of said second conductivity type nitride semiconductor layer of each of said mesa active regions;
  (e) providing the support substrate including the first conductive connection members and the second conductive connection members; and
  (f) aligning said support substrate with said transparent substrate and bonding said first pad electrode portions and said first conductive connection members, and bonding said second ohmic electrodes and said second conductive connection members.

23. The method according to claim 22, wherein step (e) comprises forming a first wiring layer and a second wiring layer on the support substrate, and forming said first conductive connection members on said first wiring layer and said second conductive connection members on said second wiring layer.

24. The method according to claim 23, wherein eutectic is formed in step (c).

25. The method according to claim 23, wherein said mesa active regions defined by said recess regions are disposed in a matrix shape.

26. The method according to claim 25, wherein said mesa active regions are defined by said recess regions to be disposed in a rectangular light emission area in said matrix shape and said mesa electrode pull-up regions are defined by said recess regions to be disposed near vertexes outside of said rectangular light emission area.

27. The method according to claim 22, wherein said mesa active regions and said mesa electrode pull-up regions are defined by said recess regions to be disposed in a rectangular area in a matrix shape.

28. The method according to claim 27, wherein said mesa electrode pull-up regions are disposed at corners of said rectangular area.

29. The method according to claim 27, wherein step (c) comprises forming a position alignment mark in each of said mesa electrode pull-up regions in an area not forming one of said first pad electrode portions.

30. The method according to claim 22, further comprising:

(g) forming a protection film disposed above said transparent substrate, exposing said first pad electrode portions on said mesa electrode pull-up regions and said second ohmic electrodes and covering said first ohmic electrode portion in said recess regions, said protection film being hard to become wettable to said conductive connection members.

* * * * *